(12) United States Patent
Eklund et al.

(10) Patent No.: US 6,218,976 B1
(45) Date of Patent: Apr. 17, 2001

(54) ANALOG-TO-DIGITAL CONVERTER WITH SUCCESSIVE APPROXIMATION

(75) Inventors: Jan-Erik Eklund, Linköping; Anders Edman, Rimforsa, both of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/293,884

(22) Filed: Apr. 19, 1999

(30) Foreign Application Priority Data

Apr. 20, 1998 (SE) .................................................. 9801367

(51) Int. Cl.$^7$ ...................................................... H03M 1/38
(52) U.S. Cl. ............................................ 341/161; 341/155
(58) Field of Search .................................. 341/155, 161, 341/139, 163

(56) References Cited

U.S. PATENT DOCUMENTS 3,646,586   2/1972   Kurz ...................................... 341/155

FOREIGN PATENT DOCUMENTS 0 406973 A1   1/1991   (EP) .
2 148938      5/1985   (GB) .

OTHER PUBLICATIONS

"A 12–Bit 500–NS Subranging ADC", IEEE Journal of Solid State Circuits, vol. 24, No. 6, pp. 1498–1506, Dec. 1989.

"A/D–conversion employing successive approximation with dual comparators", Report No. KiTH–ISY–R–1796, 951004, Linköpings Universitet.

Primary Examiner—Michael Tokar
Assistant Examiner—Jean Bruner Jeanglaude
(74) Attorney, Agent, or Firm—Burns, Doane, Swecker & Mathis, L.L.P.

(57) ABSTRACT

A process and device for providing an analog-to-digital conversion employing a successive approximation principle is provided. The search interval from a value X to a Value Y, which represents the value interval in which an unknown analog signal is to be converted to a digital signal value, is divided into a number of smaller search intervals, being divided into different area for employing a successive approximation process to iterate to the desired digital signal value. Further, reference levels are defined for each search interval to coincide with at least one other reference level, where coinciding reference level belongs to two search intervals formed by areas in a nearest larger search interval.

6 Claims, 2 Drawing Sheets

ANALOG-TO-DIGITAL CONVERTER WITH SUCCESSIVE APPROXIMATION

FIELD OF THE INVENTION

The present invention relates to a process for analog-to-digital conversion and a device for analog-to-digital conversion (ADC), preferably a process for analog-to-digital conversion employing a successive approximation principle (SA-ADC).

STATE OF THE ART

In digital signal processing it is necessary to be able to convert an analog signal to a digital signal. There are different types of analog-to-digital converters, which substantially differ in cost and performance. The cost is determined by the circuit complexity of the analog-to-digital converter and the technology required to implement circuit components with said circuit complexity. The performance is typically measured in terms of conversion rate, resolution and power consumption.

An analog-to-digital converter (ADC) employing the successive approximation principle (SA-ADC) is controlled by an algorithm, such as binary search. The analog-to-digital converter comprises in principle a sampling unit storing a momentary value of an input signal, a digital-to-analog converter (DAC) generating known reference values and a comparator comparing the stored value to a reference value. The algorithm controls the sequence of reference values in such a manner that the stored value can be determined according to a measuring scale, normally an integer represented by binary numbers. This principle is limited by a causal requirement, where a comparison must have been finalized before the algorithm can find out which reference value is to be used in the next comparison. This cycle delimits the maximum rate of a SA-ADC.

Another problem is the accuracy of the reference values. In an electric circuit, a value is set according to an exponential curve, i.e., the longer time there is available, the more accurate becomes the value. This can result in dynamical errors and is a rate depending problem. Said problem can be solved by a redundant code, see M. P. V. Kolluri, "A 12-BIT 500-NS Subranging ADC", IEEE Journal of Solid State Circuits, vol. 24, no. 6, pp. 1498–1506, December 1989; alternatively a plurality of comparators and a plurality of reference levels can be used, see P-E Danielsson, "A/D-conversion employing successive approximation with dual comparators", Report No. LiTH-ISY-R-1796, 951004, Linköpings Universitet.

DISCLOSURE OF THE INVENTION

A problem with the conversion of an analog signal value to a digital signal value employing a successive approximation principle is that such a process, according to prior art, comprises a rate limiting factor depending on its approximation process.

An object of the present invention is to increase the rate of the approximation process by an improved division of a search interval and therein arranged reference levels.

The present invention solves the above mentioned problem by defining for each search interval at least three areas, so that said areas cover the entire search interval and so that each area covers at least one other area; that each such area is defined to a new smaller search interval until a last search interval reaches a pre-set value; that a reference value is defined within each redundant part, so that N areas in a search interval give N-1 reference values; that at least one reference level in each search interval is defined to coincide with at least one other reference level, where at least one such coinciding reference level belongs to two search intervals formed by areas in a nearest larger search interval.

In order to achieve said digital signal value, an unknown sampled value is compared to all reference levels in a search interval, whereby at least one area in said search interval can be eliminated, and at the proceeding successive approximation process, the unknown sampled value is compared to all reference value in the new smaller search interval, where each choice of comparative reference level is independent of the result in the nearest preceding step, until said unknown sampled value can be determined with a pre-set accuracy.

The above described process can advantageously be implemented in an analog-to-digital converter.

An advantage of the present invention is that the approximation process can be made with low requirements of convergence.

Another advantage of the present invention is that it only comprises one comparator.

Yet another advantage with the present invention is that it facilitates a high rate implementation.

The invention will now be further described by preferred embodiments and with reference to the accompanying drawings.

PREFERRED EMBODIMENTS

Figure 1:
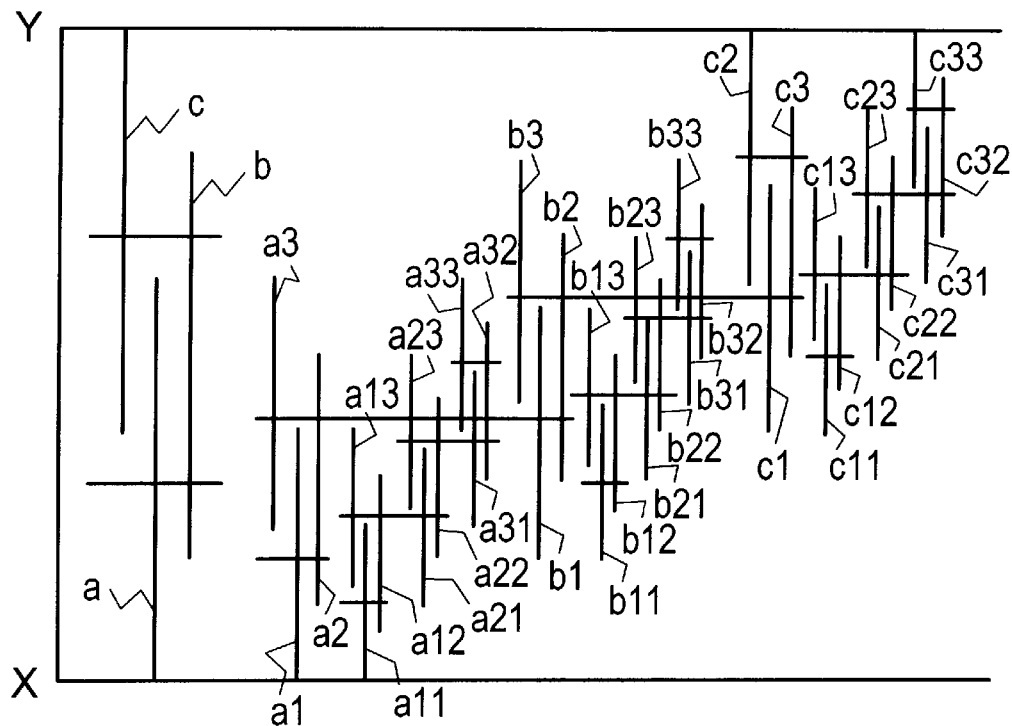
FIG. 1 is an embodiment illustrating how a search interval from a value X to a value Y can be divided according to the invention.

In FIG. 1 there is shown a search interval from a value X to a value Y, which can represent the value interval in which an unknown analog signal value shall be converted to a digital signal value. Said search interval has been divided into a number of smaller search intervals, being divided into different areas for employing a successive approximation process to iterate to the desired digital signal value.

In this embodiment the search interval X-Y is first divided into three areas a, b and c. These areas are equal in absolute values, Area a begins at the X-level and ends somewhere before the Y-level. Area b neither begins nor ends at any of the end values X or Y, but have its mid-point common with the mid-point of the X-Y interval. Area c begins somewhere in the X-Y interval and ends at the Y-level. Each of the areas, a, b and c overlaps at least one of the other areas in the same search interval, i.e., area a overlaps at least area b and area c overlaps at least area b. The areas a and c can overlap each other according to the illustrated embodiment in FIG. 1. Said arrangement of areas creates parts where so-called redundancy arises. Thus, there is redundancy in the embodiment in FIG. 1 in the entire b-area.

In this redundant part reference levels shall be arranged. In the case of using three areas in a search level, it can be looked as if area a and area c do not overlap each other, but end and begin in the same point, two different redundant parts will be created. A redundant part formed by areas c and b and another redundant part for area a and b. For each redundant part, a reference level shall be arranged, i.e., for three areas, two reference levels shall be arranged and for four areas, three reference levels shall be arranged and for N areas, N-1 reference levels shall be arranged. Thus, in the embodiment in FIG. 1, two reference levels shall be arranged in the redundant parts.

Figure 2:
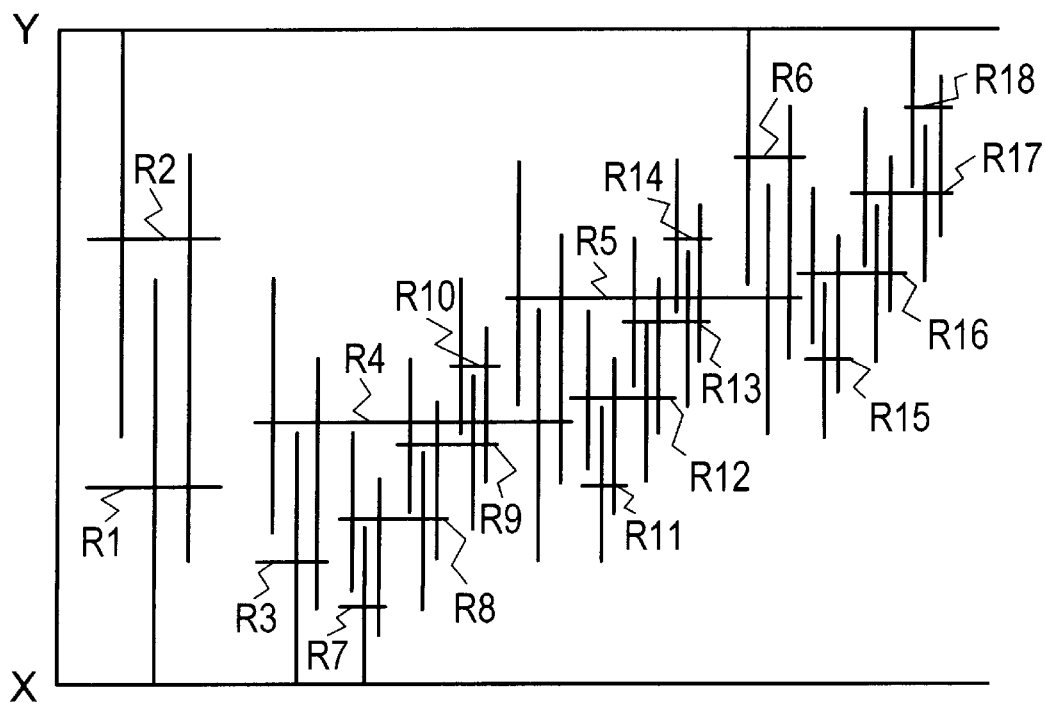
FIG. 2 is the same embodiment of the division of the search interval as in FIG. 1, wherein the reference levels have been given reference numerals.

FIG. 2 illustrates an example of how these reference levels can be arranged in the redundant parts for the embodiment according to FIG. 1. Depending on how the reference levels are placed, the proceeding search process becomes more or less effective.

In the next step the areas a, b and c have been divided into respective search intervals, so that area a forms a new search interval comprising the areas a1, a2 and a3, area b forms a new search interval comprising the areas b1, b2 and b3 and area c forms a new search interval comprising the areas c1, c2 and c3. In this embodiment each of the new smaller search intervals have been made to a reduced copy of the nearest upper search interval, i.e., the search interval comprising the areas a1, a2 and a3 is a reduced copy of the search interval comprising the areas a, b and c.

A search interval can comprise three areas while another search interval can comprise three or more areas. Thus, there are no restrictions that the search interval comprising the areas a1, a2 and a3 shall comprise as many areas as the search interval formed from area b or c, nor require larger search intervals be divided into more areas than a smaller one. The length of the areas contained in a search interval can be different. Each of the areas a1, a2 and a3 can be of different length, as goes for the areas in the other search intervals.

Thus, in FIG. 1 areas a, b and c have formed new search intervals comprising new areas a1, a2 a3; b1, b2, b3 and c1, c2 c3 respectively.

In each such new smaller search interval, two or more reference levels shall, according to what is mentioned above, be arranged depending on the number of included areas. At least one of the reference levels in each of said new smaller search interval shall be common with at least one other reference level, where at least one such other reference level belongs to a search interval of the same division step, i.e., for instance the search interval formed from the area a shall have a common reference level with the search interval from area b, and that a reference level belonging to the search interval formed from area c shall have a common reference level with the search interval formed from area b. In FIG. 2 there are examples of common reference levels such as R4 and R5 belonging to the search intervals with the areas a1, a2, a3; b1, b2, b3 and c1, c2, c3. In the embodiment shown in FIG. 2 both reference levels for the search interval become common with another reference level.

In the next step the areas a1, a2, a3; b1, b2, b3 and c1, c2, c3 have been divided into different search intervals, so that area a1 forms a new search interval comprising the areas a11, a12 and a13, area a2 forms a new search interval comprising the areas a21, a22, a23, area a3 forms a new search interval comprising the areas a31, a32 and a33, area b1 forms a new search interval comprising the areas b11, b12 and b13, area b2 forms a new search interval comprising the b21, b22 and b23, area b3 forms a new search interval comprising the areas b31, b32 and b33, area c1 forms a new search interval comprising areas c11, c12 and c13, area c2 forms a new search interval comprising areas c21, c22 and c23 and area c3 forms a new search interval comprising the areas c31, c32 and c33. In this embodiment, each of the new smaller search intervals have been made to a reduced copy of the nearest above search interval, i.e., for instance the search interval comprising the areas a11, a12 and a13 are a reduced copy of the search interval comprising the areas a1, a2 and a3.

As previously disclosed concerning arrangement of reference levels, also these search intervals shall comprise N-1 reference levels for N areas for said search interval. Also here, at least one reference level in each search interval shall be common with at least one other reference level, i.e., for instance the search interval formed from area a1 shall have a common reference level with the search interval formed from area a2 and a reference level belonging to the search interval formed from area a3 shall have a common reference level with the search interval formed from area a2. In FIG. 2 there are examples of common reference levels such as R8, R9, R12, R13, R16 and R17. Not illustrated, but absolutely conceivable is for instance to arrange the common reference level R5 together with the common reference level R13, in the same way, the common reference level R9 can be arranged to be common with the common reference level R4.

The division according to above is carried out until the last search interval reaches a pre-set given stop value.

Figure 3:
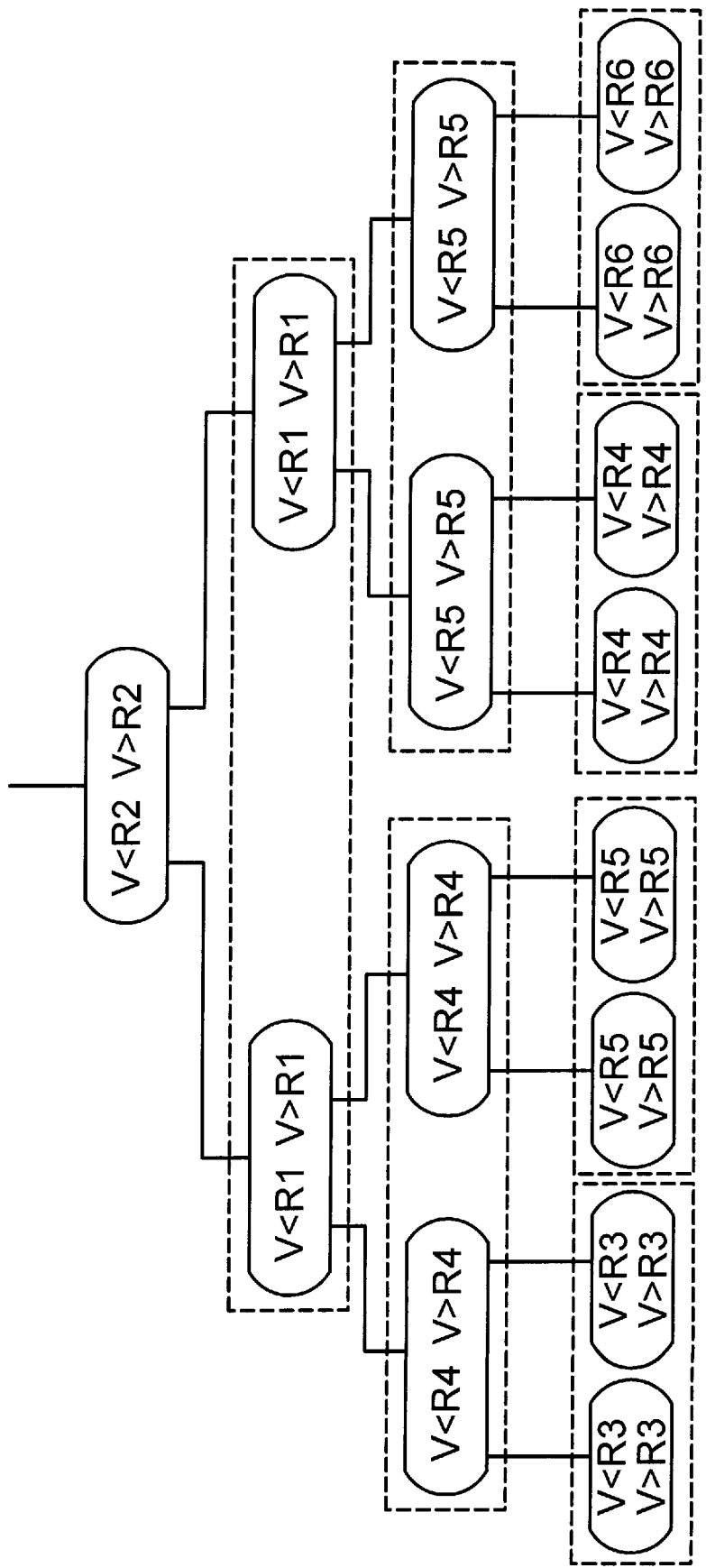
FIG. 3 illustrates a flow chart for the approximation process according to the invention.

In FIG. 3 there is an example of a flow chart for how to execute an approximation process. All reference numerals in FIG. 3 are related to FIG. 1 and FIG. 2.

In a first step an unknown sampled value V is compared to one of the reference levels for said search interval. Here, the search interval is X-Y and the reference level R2. It should be stressed that said first step in the comparison does not have to start from the initial interval as shown in FIGS. 1 and 2.

Said search interval can be part of a larger search interval, i.e., the search interval X-Y in FIGS. 1 and 2 can be part of an originally larger search interval. In other words, the approximation process can start in an arbitrary search interval provided that the unknown samples value can be defined to be included in said search interval.

The next step in the approximation process is compared to the unknown sampled value V with the reference level R1. If in the first result, the sampled value V was smaller that the reference value R2, we land up in the left branch in FIG. 3. If on the other hand, the result was that the unknown samples value V was larger than the reference value R2 we will land up in the right branch in FIG. 3. If V<R2, the area a or b are relevant and area c can be eliminated. If V>R2, area c is relevant and the areas a and b can be eliminated. Assume now that if one remain in the left branch of the flow chart in FIG. 3, i.e., the unknown sampled value V was smaller than the reference value R2 and area a or b is relevant. Independent of the result from this comparison between the unknown sampled value V and the reference value R1, in the next step, the unknown sampled values V and R4 shall be compared. This is due to that by arranging at least one reference level in each search interval common with at least one other reference level in another search interval, where at least one of said "other search interval" has also been formed from areas in a nearest larger search interval, are able to predict which next reference value shall be compared to the unknown sampled value V. It is understood that we are in the left branch of the flow chart in FIG. 3 and are about to compare the unknown sampled value to the reference level R1, as we in advance can prepare the next comparison, as it shall occur between the unknown sampled value and R4 independent of the result at the comparison to R1.

Thus, in the next step the unknown sampled value V shall be compared to the reference value R4. Dependent on whether the unknown sampled value V was smaller or larger than the reference value R1, we end up in the left or the right branch, respectively at the comparison R4. Assume that we are now in the left branch, i.e., at the comparison with R1, the unknown sampled value V was smaller than said reference value R1 and that area a is relevant and area b can be eliminated. In the next step we shall compare the unknown sampled value V to R3 for the reason that for a given search interval, here the search interval, formed by area a, we shall compare the unknown sampled value V with each reference value for that search interval. For instance, in the case a search interval comprises four areas, the unknown sampled value V shall be compared to the three reference levels for said search interval.

Thus, in the next step, we shall compare the unknown sampled value V to the reference value R3 independently of the result from the preceding step. Also here we can prepare the comparison to R3, already when we know that we are in the left branch at the comparison to R4. As the proceeding step is always independent of the result from the step before, two comparisons can be made in the same iteration loop. In other words, instead of waiting for the result from a comparison between an unknown sampled value and a reference level, next step can be prepared before the result is given. In that way, the approximation process can be speeded up as two comparisons can be made in the same iteration process. Assume that at the comparison of the unknown sampled value to the reference value R4, the result was that V<R4. We are once more in the left branch and we know that the areas a1 and a2 are relevant and that area a3 can be eliminated. At the comparison to R3 we know that at next step, V shall be compared to R8, independently of the result from the comparison to R3, etc.

The above mentioned process continuous until the unknown sampled value V can be determined with a pre-set accuracy.

In FIG. 3, comparisons, which are dependent of the previous result, have been enclosed by a dashed line, for instance in FIG. 3 it can be seen that the comparison in the left branch to R4 is independent of the result in the preceding step, when the unknown sampled value was compared to R1.

The present approximation process can be part of an analog-to-digital converter. Such an analog-to-digital converter is not further described in detail, since it is well known in prior art, as well its function and its construction, and is not part of the invention.

It will be appreciated that the invention is not limited to the embodiments mentioned above, but can be modified within the scope of the appended claims.

What is claimed is:

1. A process for analog-to-digital conversion employing a successive approximation principle for the conversion of an analog signal value to a digital signal value, the process comprising:

defining for each search interval at least three areas, wherein the at least three areas cover the entire search interval and wherein each area overlaps at least one other area creating a redundant part;

defining each of the at least three areas into a new smaller search interval until a last search interval reaches a pre-set value, defining a reference level within each redundant part, so that N areas in a search interval give N-1 reference levels, defining at least one reference level in each search interval to coincide with at least one other reference level, wherein the coinciding reference level belongs to two search intervals formed by areas in a nearest larger search interval, comparing an unknown sampled value to all reference levels in a search interval, wherein at least two areas in said search interval are eliminated, and comparing in the continuing successive approximation process, the unknown sampled value to all reference values in the new smaller search interval, where each choice of comparative reference level is independent of the result in the nearest preceding step, until said unknown sampled value can be determined with a pre-set accuracy.

2. A process according to claim 1, wherein each new smaller search interval is a reduction of the nearest larger search interval.

3. A process according to claim 2, wherein the absolute value of the area of each search interval is equal.

4. A device for analog-to-digital conversion employing a successive approximation principle for the conversion of an analog signal value to a digital signal value, the device comprising:

means for defining for each search interval at least three areas, wherein said areas cover the entire search interval, and wherein each area overlaps at least one other area;

means for defining each of said at least three areas to a new smaller search interval until a last search interval reaches a pre-set value;

means for defining a reference level within each redundant part, so that N areas in a search interval give N-1 reference levels;

means for defining at least one reference level in each search interval to coincide with at least one other reference level, where at least one such coinciding reference level belongs to two search intervals formed by areas in a nearest larger search interval;

means for comparing the unknown sampled value to all reference levels in a search interval and eliminate at least two areas in said search interval, and at said proceeding successive approximation process, means for comparing said unknown sampled value to all reference values in each new smaller search interval until said unknown sampled value reaches a pre-set accuracy, wherein each choice of comparative reference level is independent of the result of the nearest preceding step.

5. A device according to claim 4, wherein each new smaller search interval is arranged to reduce the nearest larger search interval.

6. A device according to claim 5, wherein the absolute value of the area of each search interval is equal.

* * * * *